United States Patent [19]

Clark

[11] 4,189,680

[45] Feb. 19, 1980

[54] ISOLATED SIGNAL CONDITIONER

[75] Inventor: Vernon R. Clark, Bartlesville, Okla.

[73] Assignee: Phillips Petroleum Co., Bartlesville, Okla.

[21] Appl. No.: 865,167

[22] Filed: Dec. 28, 1977

[51] Int. Cl.² ............................................. H03F 17/00
[52] U.S. Cl. .................................... 330/59; 330/199; 330/297; 330/308
[58] Field of Search ............. 250/214 A; 330/59, 199, 330/308, 297

[56] References Cited
U.S. PATENT DOCUMENTS
4,030,041   6/1977   Sasaki ............................. 330/59 X

*Primary Examiner*—Lawrence J. Dahl

[57] ABSTRACT

An isolated signal conditioning circuit is provided whereby control or measurement circuitry is isolated from a load, such as a control instrument, through the use of an optically coupled isolation amplifier. The control or measurement signal is conditioned by the signal conditioning circuit so as to provide a signal to a load, such as a control instrument, which is compatible with the input requirements of the load.

30 Claims, 1 Drawing Figure

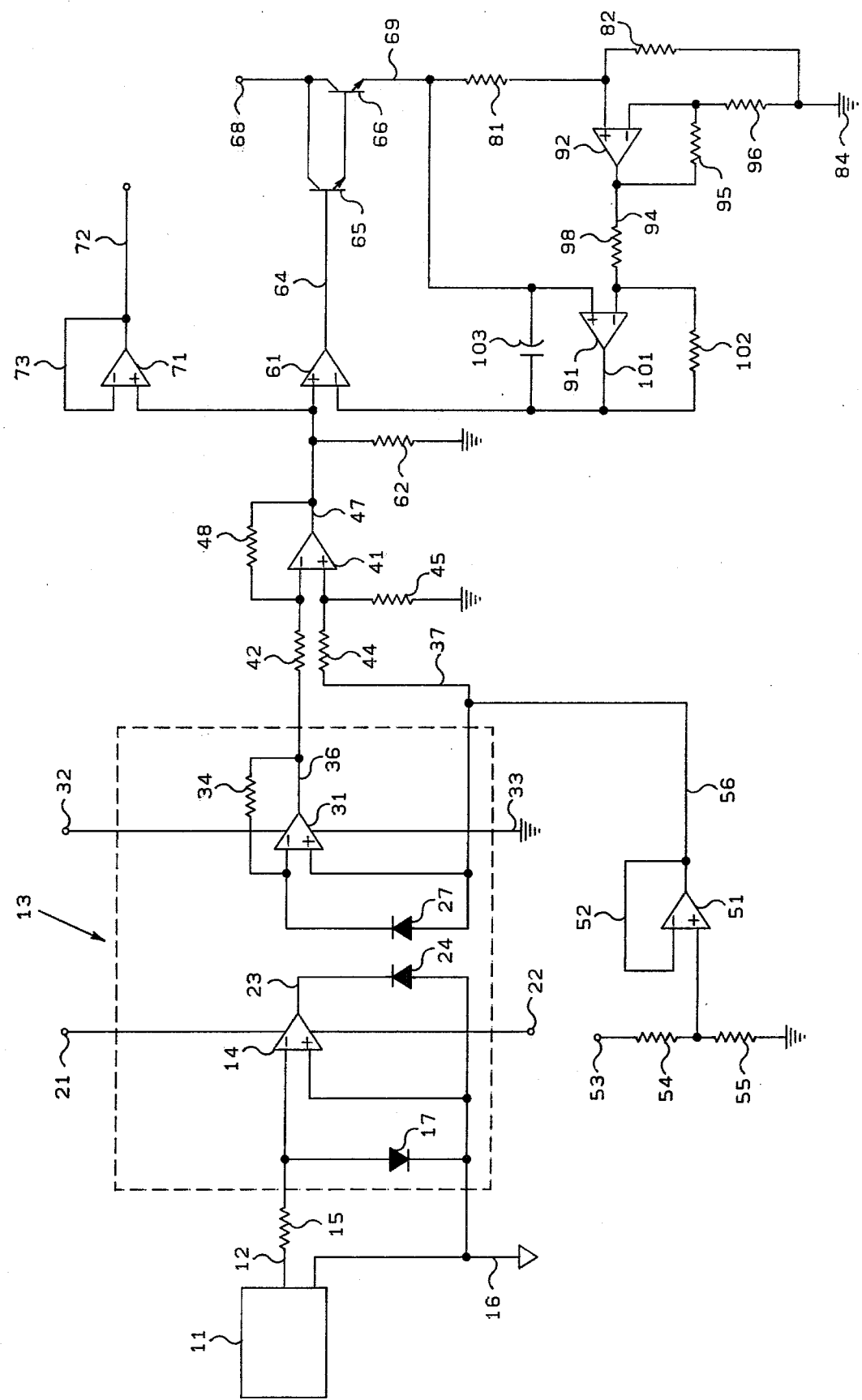

ISOLATED SIGNAL CONDITIONER

This invention relates to electrical signal conditioning. In a first particular aspect this invention relates to method and apparatus for conditioning an input electrical signal to provide an output electrical signal which can be received by different types of loads. In a second particular aspect this invention relates to method and apparatus for using an optically coupled isolation amplifier to isolate electrical circuits. In a third particular aspect this invention relates to method and apparatus for utilizing a floating ground on the optically coupled isolation amplifier so that only one power supply is needed for the second stage of an optically coupled isolation amplifier where two power supplies would normally be required.

In various types of electrical measuring and control systems there is a need to establish an output electrical signal which is representative of a measured or computed signal. For example, an automatic process control system may utilize a digital computer to calculate the desired setting of a process variable. The digital output signal from the computer is converted to a corresponding analog signal which is capable of being received by a conventional control instrument. However, the output signal from a digital-to-analog converter usually is an extremely small current so that amplification is necessary in order for the output signal to be utilized by the control instrument. Since control instruments of various configurations may be employed in plant operations, it is desirable to provide current amplifying apparatus which is capable of establishing output control signals which can be received by different types of control instruments. Other applications may make it desirable to buffer or amplify a voltage signal which has been measured or computed.

Accordingly, it is a first object of this invention to provide method and apparatus for conditioning an input electrical signal to provide an output electrical signal which can be received by different types of loads.

It is highly desirable to isolate the control or measurement circuitry from the loads such as control instruments. Recently optically coupled isolation amplifiers have been developed which may be used advantageously to provide the desired isolation. However, one disadvantage of using optically coupled isolation amplifiers is that the output stage of some models require the use of two power supplies.

Accordingly, it is a second object of this invention to provide method and apparatus for using an optically coupled isolation amplifier to isolate electrical circuits. A third object of this invention is to provide method and apparatus for utilizing a floating ground on the optically coupled isolation amplifier so that only one power supply is needed for the second stage of an optically coupled isolation amplifier where two power supplies would normally be required.

In accordance with the present invention method and apparatus is provided whereby a first amplifier receives an input electrical signal and provides an output signal to a current amplifier. The input electrical signal is also received by a second amplifier which provides a buffered voltage output. A sense resistor and a load are connected in the output circuit of the current amplifier. A differential amplifier circuit provides a feedback from the sense resistor to the first amplifier. The value of the current flowing through the sense resistor is directly related to the input electrical signal.

An optically coupled isolation amplifier is used to isolate the first amplifier from the source of the input electrical signal. A floating ground is utilized so that the output stage of the optically coupled isolation amplifier requires the use of only one power supply. A third amplifier is used to convert the signal level out of the isolation amplifier to a signal level which is compatible with the first amplifier and its associated circuitry.

Other objects and advantages of the invention will be apparent from the description of the invention and the appended claims thereto as well as from the detailed description of the drawing which is a schematic of a signal conditioning circuit using an optically coupled isolation amplifier to provide isolation.

The invention is described in terms of a preferred embodiment wherein the 3650, Optically Coupled Linear Isolation Amplifier, manufactured by Burr-Brown, Tucson, Ariz., is utilized to provide isolation. Also the invention is described in terms of a particular circuit configuration. The invention is, however, applicable to other functionally similar circuit configurations and is applicable to other types of optically coupled isolation amplifiers where a floating ground may be utilized to reduce the number of power supplies required by the isolation amplifier.

Also for the sake of convenience, power supplies and power levels required by the various chips shown in FIG. 1 have not been shown or specified where not a part of the invention. Power levels required by the chips are specified by the manufacturers and are well known to those familiar with the art.

It should however be noted that all of the operational amplifiers utilized in the preferred embodiment of this invention, except for the isolation amplifier, are single supply operational amplifiers. Thus, in the preferred embodiment of the invention the output stage of the isolation amplifier and the remaining operational amplifiers outside the isolation amplifier are all supplied by a single voltage source.

Referring now to the drawing the output signal 12 from a digital-to-analog converter means 11 is supplied to the optically coupled isolation amplifier 13. The output signal 12 is supplied directly to the inverting terminal of operational amplifier 14. The noninverting terminal of operational amplifier 14 shares a common ground 16 with the digital-to-analog converter means 11. The photo diode 17 is connected across the noninverting and inverting terminals of operational amplifier 14. The output signal 23 of operational amplifier 14 is connected to a common ground 16 through the light emitting diode 24. Power supply 21 provides a positive 15 volts to the operational amplifier 14 in this preferred embodiment. Power supply 22 provides a negative 15 volts to operational amplifier 14 in this preferred embodiment. The photo diode 27 is connected across the noninverting and inverting terminals of operational amplifier 31. Power supply 32 provides a positive 24 volts to the operational amplifier 31 in this preferred embodiment. Signal line 33, which would normally be at a negative potential, is grounded in this preferred embodiment. The output signal 36, from operational amplifier 31, is fed back to the inverting terminal of operational amplifier 31 through resistor 34.

Power supply 53 provides a positive 24 volts to the voltage divider network made up of resistors 54 and 55. As a result, the noninverting terminal of operational amplifier 51 sees a positive 12 volts. The output signal 56 from operational amplifier 51 is fed back to the inverting terminal of operational amplifier 51 through signal line 52. The output signal 56 from operational amplifier 51 is also tied to the noninverting terminal of operational amplifier 31.

The output signal 36 from operational amplifier 31 is supplied to the inverting terminal of operational amplifier 41 through resistor 42. The signal line 37 which is tied to the noninverting terminal of operational amplifier 31 is tied to the noninverting terminal of operational amplifier 41 through the voltage divider network made up of resistors 44 and 45. The output signal 47 from operational amplifier 41 is fed back to the inverting terminal of operational amplifier 41 through resistor 48. The output signal 47 is also supplied to ground through resistor 62 and is supplied to the noninverting terminals of operational amplifiers 61 and 71.

The output signal 72 from operational amplifier 71 is fed back to the inverting terminal of operational amplifier 71 through signal line 73. The output signal 64 from operational amplifier 61 is supplied to the base of transistor 65, which together with transistor 66 forms a darlington pair. The power supply 68 provides power to transistor 65 and 66. The output signal 69 from transistor 66 is grounded at ground 84 through resistors 81 and 82. Resistor 81 will be referred to as a sense resistor. Resistor 82 will be referred to as a load resistor and is representative of a load such as a control instrument. The output signal 69 is also supplied to the noninverting terminal of operational amplifier 91 and is also supplied to the noninverting terminal of operational amplifier 92 through resistor 81. The output signal 94 from operational amplifier 92 is fed back to the inverting terminal of operational amplifier 92 through the voltage divider network made up of resistors 95 and 96. The output signal 94 is also supplied to the inverting terminal of operational amplifier 91 through resistor 98. The output signal 101 from operational amplifier 91 is fed back to the inverting terminal of operational amplifier 91 through resistor 102. The output signal 101 is also supplied to the inverting terminal of operational amplifier 61. Capacitor 103 is utilized as a frequency compensation capacitor for operational amplifier 91.

The optically coupled isolation amplifier 13 provides electrical isolation between the digital-to-analog converter 11 and the remainder of the signal conditioning circuit shown in FIG. 1, including a load such as a control instrument which is represented by resistor 82. The manner in which an optically coupled isolation amplifier provides isolation is well known. The operational details of the Burr-Brown 3650 are set forth in detail in 3650-3652, *Optically Coupled Linear Isolation Amplifier*, Burr-Brown, Tucson, Ariz., February, 1976.

The normal biasing arrangement for the Burr-Brown 3650 includes positive power supply 32 termed Vcc and a negative power supply termed −Vcc on signal line 33. This arrangement allows the output signal 36 from operational amplifier 31 to deviate from +Vcc to −Vcc about a quiescent (no input signal present) reference voltage level of 0 volts. In this invention, a unipolar power supply 32 was utilized instead of the bipolar power supply normally required. This was accomplished by means of operational amplifier 51 and its associated circuitry. Power supplys 32, 53 and 68 are the same power supply in this preferred embodiment. The +24 volts is supplied across a voltage divider network, made up of resistors 54 and 55, to the noninverting terminal of operational amplifier 51. Resistors 54 and 55 are equal; thus signal 56 has a voltage level of +12 volts. With this arrangement, the quiescent output signal 36 of operational amplifier 31 is +12 volts. As far as the operational amplifier 31 is concerned, it is effectively seeing a +Vcc of +12 volts and a −Vcc of −12 volts and is therefore capable of swinging +Vcc about a new reference level of +12 volts. Voltages other than +24 volts may obviously also be used.

Operational amplifier 41 is utilized in order to convert the new reference level of +12 volts back to the 0 volt reference level required by the remaining circuit shown in FIG. 1. Operational amplifier 41, as configured, is known as a differential-to-single-ended converter. Under quiescent conditions, signal 36 has a voltage level of +12 volts and signal line 37 has a voltage level of +12 volts. The output signal 47 from operational amplifier 41 would have a 0 voltage level under these conditions. With signal present, the output signal 36 may vary from +12 volts to +2 volts in the preferred embodiment of this invention. The output signal 47 would thus vary from 0 volts as a reference level to +10 volts which is compatible with the output circuit of the invention shown in FIG. 1.

The output signal 47 from operational amplifier 41 is supplied to the noninverting terminal of operational amplifier 71, which acts as a buffer amplifier with unity gain. Signal 72 will thus have the same voltage level as signal 47, but if signal 72 is supplied to some load the buffer amplifier will prevent loading of the output of operational amplifier 41. Signal 72 is representative of and proportional to the output signal 12 from the digital-to-analog converter means 11.

The output signal 47 from operational amplifier 41 is also supplied to the noninverting terminal of operational amplifier 61. The output signal 64, from operational amplifier 61, which has a very low current level, is greatly amplified by the Darlington pair made up of transistors 65 and 66. The signal level of output signal 69 is determined by the degree to which transistors 65 and 66 are turned on by output signal 64. Output signal 69 is supplied across the sense resistor 81 to a load which is represented by resistor 82. The load may be a control instrument or other similar device.

It is desirable to be able to supply a standard current, for example a 4 ma to 20 ma loop or a 10 ma to 50 ma loop, to the load 82 regardless of what type of load is connected. This is accomplished by utilizing the feedback loop, made up by operational amplifiers 91 and 92 and their associated circuitry, to force output signal 69 to a desired signal level no matter what load 82 is attached. A desired signal level for output signal 69 in the preferred embodiment of this invention, is one which gives a voltage drop of 0.2 to 1.0 volts across the sense resistor 81 depending on the value of output signal 47. Thus a 50Ω sense resistor 81 will provide a 4 ma to 20 ma current to the load 82 and a 20Ω sense resistor 81 will provide a 10 ma to 50 ma current to the load 82.

In this preferred embodiment resistors 96 and 102 are 90 KΩ resistors. Resistors 95 and 98 are 10 KΩ resistors. Thus, if the voltage drops across the sense resistor 81 is 1.0 volt, the output signal 101 from operational amplifier 91 will have a voltage level of 10 volts. The feedback network formed by operational amplifiers 91 and 92 balance the output circuit so that a signal having a desired current level can be supplied to the load 82. The output signal supplied to the load will be representative of the output signal 12 from the digital-to-analog converter means 11.

The invention has been described in terms of its presently preferred embodiment as is shown in FIG. 1. Specific components which are available commercially and which can be used in the practice of the invention as shown in FIG. 1 follow. Values of resistors and capacitors used in the circuit are also given. It should be recognized that different types of operational amplifiers could be utilized. Also many different combinations of capacitance values and resistance values are possible.

| Resistors 15,42,44,48,45,54,55 | 500 KΩ AD1830 LD/500K Analog Devices |
|---|---|
| Resistor 62 | 1 KΩ, RN550, TRW/IRC |
| Resistor 96,102 | 90 KΩ, RN550, TRW/IRC |
| Resistor 98,95 | 10 KΩ AD1841 LD/10K Analog Devices |
| Capacitor 103 | .001 μf Sprague, 5GA - D10 |
| Operational Amplifiers 41,51,61,71,91,92 | LM324 National Semiconductor |
| Transistors 65 and 66 | MPSU45, Motorola |

While the invention has been described in terms of the presently preferred embodiment, reasonable variations and modifications are possible by those skilled in the art, within the scope of the described invention and the appended claims.

That which is claimed is:

1. Apparatus comprising:
    an isolation amplifier having an input stage which is optically coupled to an output stage where said output stage has a first power input and a second power input;
    means for grounding said second power input;
    means for supplying a voltage level of $V_2$ to said first power input;
    means for establishing a reference potential for said output stage of said isolation amplifier at a voltage level $V_2/2$, which is a voltage level other than zero volts, a first signal representative of the output signal from said output stage of said isolation amplifier having a voltage level which ranges from $+(V_2-V_2/2)$ to $-V_2/2$ around said reference potential of $V_2/2$ in response to an optical input signal from said input stage.

2. Apparatus in accordance with claim 1 wherein said means for establishing a ground potential at a voltage level $V_3$ comprises an operational amplifier which supplies a second signal having a voltage level $V_1$ to the ground of said output stage of said isolation amplifier.

3. Apparatus in accordance with claim 2 wherein said operational amplifier is a single supply operational amplifier capable of being operated from said voltage level $V_2$.

4. Apparatus in accordance with claim 1 additionally comprising:
    means for supplying a second signal, representative of an electrical input signal, to said input stage of said isolation amplifier; and
    means for buffering said first signal, which is representative of said second signal, to provide a third signal to a load.

5. Apparatus in accordance with claim 4 wherein said means for buffering is a single supply operational amplifier capable of being operated from said voltage level $V_2$.

6. Apparatus in accordance with claim 1 additionally comprising:
    means for supplying a second signal representative of an electrical input signal to said input stage of said isolation amplifier;
    a current amplification circuit capable of supplying a current signal, representative of the voltage level of an input signal, to a load; and
    means for supplying said first signal, which is representative of said second signal, to said current amplification circuit.

7. Apparatus in accordance with claim 6 wherein said current amplification circuit comprises:
    a first single supply operational amplifier, having an inverting and a noninverting input and an output;
    means for supplying said first signal to the noninverting terminal of said first single supply operational amplifier;
    a current amplifier having the input thereof connected to the output of said first single supply operational amplifier;
    a resistor having first and second terminals;
    a load;
    means for connecting the first terminal of said resistor to the output of said current amplifier;
    means for connecting the second terminal of said resistor to said load;
    a differential amplifier, made up of second and third single supply operational amplifiers, having the inputs thereof connected across said resistor and the output thereof connected to the inverting terminal of said first single supply operational amplifier in such a manner that the voltage drop across said resistor is maintained at a desired level, thus providing a current signal, representative of said first signal, to said load.

8. Apparatus in accordance with claim 7 wherein said first, second, and third angle supply operational amplifiers are capable of being operated from said voltage level $V_2$.

9. Apparatus in accordance with claim 1 additionally comprising:
    means for supplying a second signal, representative of an electrical input signal, to said input stage of said isolation amplifier; and
    a differential-to-single-ended converter means which is utilized to translate said first signal, which is representative of said second signal, from said reference level $V_2/2$ to a third signal having a zero voltage reference level.

10. Apparatus in accordance with claim 9 wherein said differential-to-single-ended converter means is a single supply operational amplifier, with appropriate biasing, capable of being operated from said voltage level $V_2$.

11. Apparatus in accordance with claim 9 additionally comprising:
    means for buffering said third signal, which is representative of said second signal, to provide a fourth signal to a load.

12. Apparatus in accordance with claim 11 wherein said means for buffering is a single supply operational amplifier capable of being operated from said voltage level $V_2$.

13. Apparatus in accordance with claim 9 additionally comprising:

a current amplification circuit capable of supplying a current signal, representative of the voltage level of an input signal, to a load; and means for supplying said third signal, which is representative of said second signal, to said current amplification circuit.

14. Apparatus in accordance with claim 13 wherein said current amplification circuit comprises:

a first single supply operational amplifier, having an inverting and a noninverting input and an output;

means for supplying said third signal to the noninverting terminal of said first single supply operational amplifier;

a current amplifier having the input thereof connected to the output of said first single supply operational amplifier;

a resistor having first and second terminals;

a load;

means for connecting the first terminal of said resistor to the output of said current amplifier;

means for connecting the second terminal of said resistor to said load;

a differential amplifier, made up of second and third single supply operational amplifiers, having the inputs thereof connected across said resistor and the output thereof connected to the inverting terminal of said first single supply operational amplifier in such a manner that the voltage drop across said resistor is maintained at a desired level thus providing a current signal, representative of said third signal, to said load.

15. Apparatus in accordance with claim 14 wherein said first, second, and third single supply operational amplifiers are capable of being operated from said voltage level $V_2$.

16. A method for utilizing an isolation amplifier, having an input stage which is optically coupled to an output stage where said output stage has a first power input and a second power input, to electrically isolate a first signal representative of an input electrical signal from a load comprising the steps of:

grounding said second power input;

supplying a voltage level of $V_2$ to said first power input;

establishing a reference potential for said output stage of said isolation amplifier at a voltage level $V_2/2$, which is a voltage level other than zero volts, a second signal representative of the output signal from said output stage of said isolation amplifier having a voltage level which ranges from $+(V_2-V_2/2)$ to $-V_2/2$ around said reference potential of $V_2/2$ in response to an optical input signal from said output stage.

17. A method in accordance with claim 16 wherein said step of establishing a ground potential at a voltage level $V_3$ comprises supplying a third signal having a voltage level of $V_1$ from an operational amplifier to the ground of said output stage of said isolation amplifier.

18. A method in accordance with claim 17 comprising the additional step of operating said operational amplifier, which is a single supply operational amplifier, from said voltage level $V_2$.

19. A method in accordance with claim 16 comprising the additional step of buffering said second signal to provide a third signal to a load.

20. A method in accordance with claim 16 comprising the additional step of supplying said second signal to a single supply operational amplifier, capable of being operated from said voltage level $V_2$, to buffer said second signal and supply a third signal from the output of said single supply operational amplifier to a load.

21. A method in accordance with claim 16 comprising the additional step of providing a current signal, representative of said second signal, to a load.

22. A method in accordance with claim 21 wherein said step of providing a current signal, representative of said second signal, to a load comprises:

supplying said second signal to the noninverting terminal of a first single supply operational amplifier;

supplying the output of said first single supply operational amplifier to the input of a current amplifier;

supplying the output of said current amplifier through a resistor to a load;

connecting a differential amplifier, made up of second and third single supply operational amplifiers, across said resistor; and supplying the output of said differential amplifier to the inverting terminal of said first single supply operational amplifier in such a manner that the voltage drop across said resistor is maintained at a desired level, thus providing a current signal, representative of said second signal, to said load.

23. A method in accordance with claim 22 comprising the additional step of operating said first, second, and third single supply operational amplifiers from said voltage level $V_2$.

24. A method in accordance with claim 16 comprising the additional step of translating said second signal from said reference level $V_2/2$ to a third signal having a zero voltage reference level.

25. A method in accordance with claim 24 comprising the additional step of operating a single supply operational amplifier, which is utilized to translate said second signal to said third signal, from a said voltage level $V_2$.

26. A method in accordance with claim 24 comprising the additional step of buffering said third signal to provide a fourth signal to a load.

27. A method in accordance with claim 24 comprising the additional step of supplying said third signal to a single supply operational amplifier, capable of being operated from said voltage level $V_2$, to buffer said third signal and supply a fourth signal from the output of said single supply operational amplifier to a load.

28. A method in accordance with claim 24 comprising the additional step of providing a current signal, representative of said third signal, to a load.

29. A method in accordance with claim 28 wherein said step of providing a current signal, representative of said third signal, to a load comprises:

supplying said third signal to the noninverting terminal of a first single supply operational amplifier;

supplying the output of said first single supply operational amplifier to the input of a current amplifier;

supplying the output of said current amplifier through a resistor to a load;

connecting a differential amplifier, made up of second and third single supply operational amplifiers, across said resistor; and supplying the output of said differential amplifier to the inverting terminal of said first single supply operational amplifier in such a manner that the voltage drop across said resistor is maintained at a desired level, thus providing a current signal, representative of said third signal, to said load.

30. A method in accordance with claim 29 comprising the additional step of operating said first, second, and third single supply operational amplifiers from said voltage level $V_2$.

* * * * *

UNITED STATES PATENT AND TRADEMARK OFFICE
CERTIFICATE OF CORRECTION

PATENT NO. : 4,189,680
DATED : February 19, 1980
INVENTOR(S) : Vernon R. Clark

It is certified that error appears in the above-identified patent and that said Letters Patent are hereby corrected as shown below:

Column 5, Claim 2, line 4, "$V_1$" should read --- $V_2^2$ ---.

Column 7, Claim 17, line 4, "$V_1$" should read --- $V_2^2$ ---.

Signed and Sealed this

Twenty-third Day of September 1980

[SEAL]

Attest:

SIDNEY A. DIAMOND

Attesting Officer

Commissioner of Patents and Trademarks